United States Patent [19]

Tanaka et al.

[11] Patent Number: 4,788,663

[45] Date of Patent: Nov. 29, 1988

[54] NONVOLATILE SEMICONDUCTOR MEMORY DEVICE WITH A LIGHTLY-DOPED DRAIN STRUCTURE

[75] Inventors: Sumio Tanaka, Tokyo; Shinji Saito, Yokohama; Shigeru Atsumi, Tokyo; Nobuaki Ohtsuka, Yokohama, all of Japan

[73] Assignee: Kabushiki Kaisha Toshiba, Kawasaki, Japan

[21] Appl. No.: 42,877

[22] Filed: Apr. 24, 1987

[51] Int. Cl.[4] .................. G11C 11/34; G11C 7/00; H01L 29/78
[52] U.S. Cl. .................. 365/185; 365/189; 357/23.5
[58] Field of Search .............. 365/185, 218, 183, 189, 365/178, 149, 212; 357/23.5

[56] References Cited

U.S. PATENT DOCUMENTS 4,628,487 12/1986 Smayling ............................ 365/185
4,663,740  5/1987 Ebel .................................... 365/185

OTHER PUBLICATIONS

Pathak et al., "A 25ns 16K CMOS PROM Using a 4-Transistor Cell," IEEE International Solid-States Circuits Conference, pp. 162∝163, Feb. 14, 1985.

Pathak et al., "A 25-ns 16K CMOS PROM Using a Four-Transistor Cell and Differential Design Techniques," IEEE Journal of Solid-State Circuits, vol. SC-20, No. 5, pp. 964-970, Oct. 1985.

Primary Examiner—Terrell W. Fears
Assistant Examiner—Melissa J. Kova
Attorney, Agent, or Firm—Finnegan, Henderson, Farabow, Garrett, & Dunner

[57] ABSTRACT

Each memory cell in an EPROM includes two memory cell transistors which share a common floating gate and have two separated drains, one of which is connected to a read bit line and the other of which is connected to write bit line. In this EPROM, the read memory cell transistor of the read bit line has a lower hot electron injection rate than the hot electron injection rate of the write memory cell transistor of the write bit line. A bit line voltage booster is connected to the read bit line.

17 Claims, 5 Drawing Sheets

F I G. 4
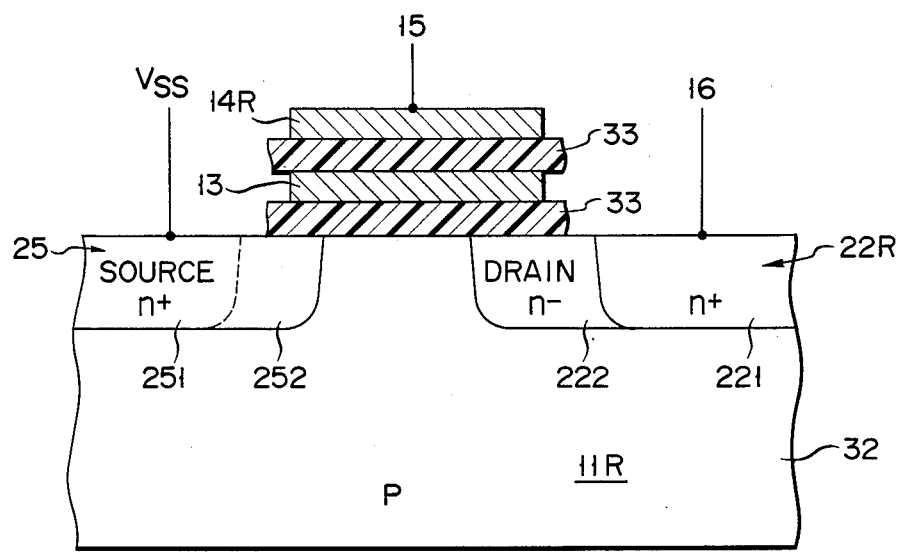

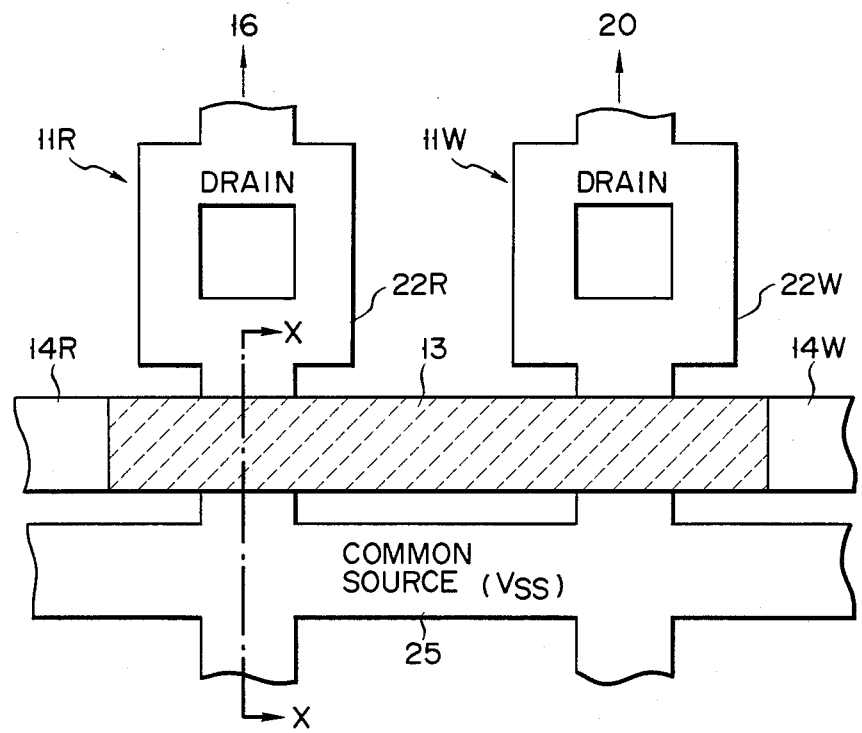
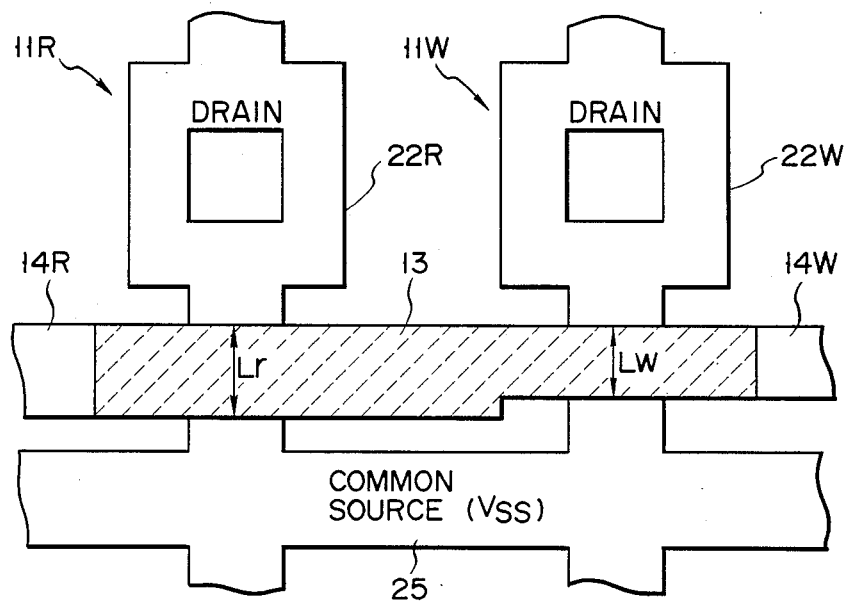

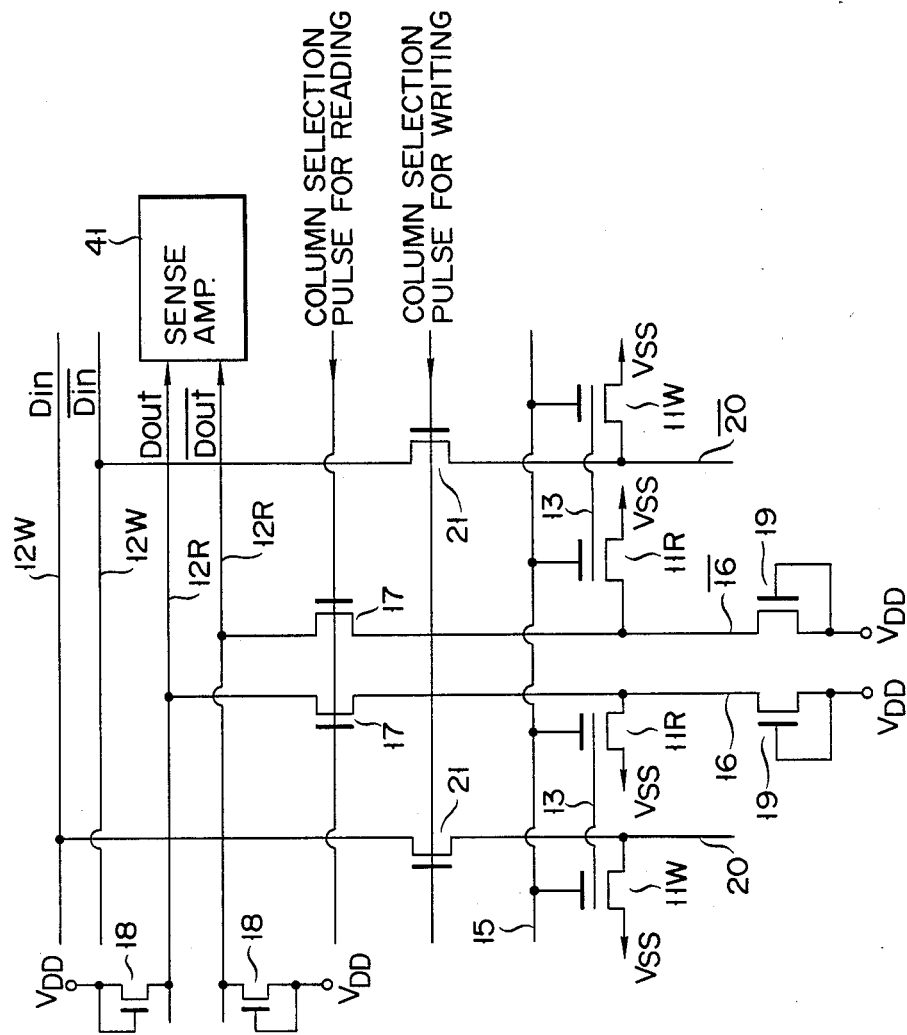

NONVOLATILE SEMICONDUCTOR MEMORY DEVICE WITH A LIGHTLY-DOPED DRAIN STRUCTURE

BACKGROUND OF THE INVENTION

The present invention relates to a nonvolatile semiconductor memory device and, more particularly, to an erasable (by use of ultraviolet rays) programmable read-only memory (EPROM) having two transistors with a common floating gate and two separate drains, one of which serves as a read drain and the other of which serves as a write drain.

FIG. 1 shows part of a conventional EPROM having cell transistors. Bit line 62 is connected to the drain (D) of cell transistor 61. Word line 63 is connected to the control gate (G) of transistor 61. A ground voltage circuit is connected to the source (S) of transistor 61. Bit line 62 is commonly used in the read and write modes. Since the read time is longer than the write time, unintentional writing could occur by injection of hot electrons generated in the read mode. In order to prevent this drawback, bit line clamp circuit 64 is connected to bit line 62, and a bit line voltage (i.e., the drain voltage of transistor 61) is clamped to a level (e.g., 1 to 2 V) considerably lower than the power source voltage.

When the bit line voltage is kept at a very low level, the magnitude of the memory cell current becomes insufficient, and the electrostatic capacitance of bit ine 62 increases drastically. The slewing rate of the bit line voltage then becomes undesirably lower than that of other memory devices such as a static random-access memory (SRAM).

SUMMARY OF THE INVENTION

The object of the present invention is to provide an erasable programmable read-only memory (EPROM) capable of performing high-speed programming and fast read access.

In order to achieve the above object of the present invention, an EPROM is provided wherein each memory cell includes two memory cell transistors which share a common floating gate and have two separate drains, one of which is connected to a read bit line and the other one of which is connected to a write bit line.

In this EPROM, the read memory cell transistor on the read bit line side is formed such that a hot electron injection rate thereof is lower than that of the write memory cell transistor of the write bit line. In addition, the bit line clamp circuit is not necessary in the read bit line.

A required write voltage can be fully applied to the write bit line independently of the read transistor, so that high-speed programming can be performed. Furthermore, since the hot electron injection rate of the read transistor is lower than that of the write transistor, the read bit line voltage clamp circuit is not necessary. Therefore, the cell current in the read mode can be increased and the bit line capacitance can be decreased. Unlike in the conventional device shown in FIG. 1, the read voltage of the read bit line is not clamped to a very low level before being transmitted to a sense amplifier, to thereby achieve high-speed read access.

In order to lower the hot electron injection rate in the read transistor to less than that in the write transistor, the read transistor is constituted by a lightly-doped drain (LDD) transistor, and the drain diffusion concentration of the write transistor is controlled to be higher than that of the LDD transistor, for example. However, the sources of the read and write transistors can be but do not have to be lightly-doped sources (LDSs).

BRIEF DESCRIPTION OF THE DRAWINGS

FIG. 3 is a plan view showing a pattern of memory cell transistors shown in FIG. 2;

FIG. 4 is a sectional view of the read transistor in FIG. 3, taken along the line X—X thereof;

FIG. 5 is a plan view of a modification of FIG. 3, showing a pattern in which the channel length (Lw) of the write transistor is shorter than the channel length (Lr) of the read transistor; FIGS. 6, 6A, and 6B together show another modification of FIG. 3, in which FIGS. 6A and 6B are respectively sectional views of the structure in FIG. 6, taken along the lines A—A and B—B thereof, and wherein the depth (Dw1) of the drain diffusion layer of the write transistor is less than the drain diffusion layer depth (Dr1) of the read cell transistor; and FIG. 7 is a circuit diagram showing part of an EPROM according to an application of the present invention.

DETAILED DESCRIPTION OF THE PREFERRED EMBODIMENT

A preferred embodiment according to the present invention will now be described, with reference to the accompanying drawings.

Figure 2:
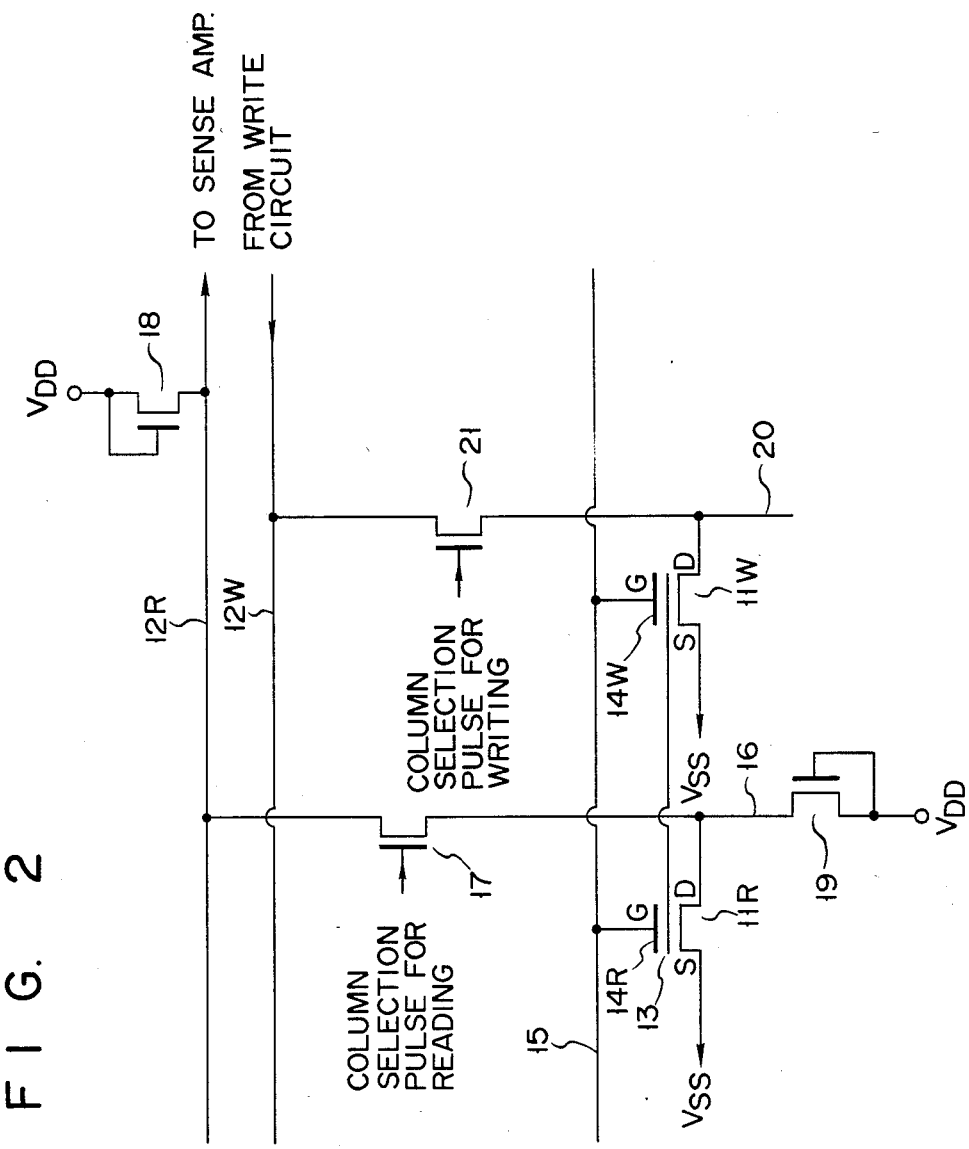
FIG. 2 is a circuit diagram showing part of an EPROM according to an embodiment of the present invention.

FIG. 2 shows part of an EPROM. Reference numerals 11R and 11W respectively denote read and write memory cell transistors which share common floating gate 13. The drains (D) of transistors 11R and 11W are separated from each other, and transistors 11R and 11W together constitute one memory cell. Control gates 14R and 14W of transistors 11R and 11W are commonly connected to one word line 15. The source (S) of transistor 11R is connected to the VSS power source (i.e., the ground voltage), and the drain thereof is connected to read bit line 16. One end of bit line 16 is connected to read bit line column-selection switching transistor 17 and to a sense amplifier (not shown) via bit line 12R, without going through a bit line clamp circuit, unlike in a conventional circuit. Bit line 12R, connected to the input terminal of the sense amplifier, is connected to the VDD power source via normally ON type load transistor 18.

The other end of read bit line 16 is connected to the VDD power source via normally ON type bit line voltage-load transistor 19 (e.g., an n-channel enhancement MOS transistor whose drain and gate are connected to each other). An increase in the voltage of bit line 16, by the use of transistor 19, causes an increase in the cell current supplied from transistor 11R, and at the same time, a decrease in the p-n junction capacitance of bit line 16.

The source (S) of write transistor 11W is connected to the VSS power source, and the drain (D) thereof is connected to bit line 20. One end of bit line 20 is connected to a write circuit (not shown) via column-selection switching transistor 21 and write bit line 12W.

FIG. 3 shows part of an IC pattern of one memory cell consisting of read and write transistors 11R and 11W. Reference numeral 22R denotes a drain region of transistor 11R; 13, a common floating gate shared by transistors 11R and 11W; 14R and 14W, control gates, respectively; 25, a common source region (VSS power source line); and 22W, a drain region of transistor 11W. In this case, drain region 22W of write transistor 11W comprises a diffusion layer of a high impurity concentration (n+), in the same manner as in the conventional structure, unlike the LDD.

Read transistor 11R comprises drain region 22R having an LDD structure, as is shown in FIG. 4. Diffusion layer 221 of a high impurity concentration (n+) and diffusion layer 222 of a low impurity concentration (n−) are formed in drain region 22R to prevent hot electrons from being injected into floating gate 13. This is the characteristic feature of this embodiment. Referring to FIG. 4, reference numeral 32 denotes a p-type Si substrate; 33, an insulating film such as an $SiO_2$ film; 14R, a control gate; and 25, a source region. Source region 25 of transistor 11R (and 11W) may comprise a lightly-doped source (LDS) structure including n+-type diffusion layer 251 and n−-type diffusion layer 252 (region 25 can, however, be formed only of the n+-type layer).

In the EPROM having the above arrangement, as shown in FIGS. 2 to 4, column-selection switching transistor 21 for write bit line 12W is turned on in response to a column-selection pulse for writing in the write mode. A high write voltage is applied to write bit line 20. Word line 15 is selected to apply a high voltage to control gate 14W. Then, high-speed write access is performed in the same manner as in the conventional device.

Figure 1:
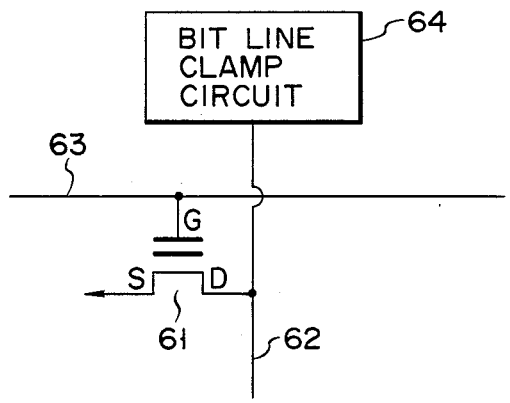
FIG. 1 is a circuit diagram showing part of a conventional EPROM.

When the memory cell is in the read mode, column-selection switching transistor 17 for the read bit line is turned on in response to a column-selection pulse for reading. A read voltage is applied to control gate 14R, for it to perform read access in the same manner as in a conventional device. In this case, however, since the voltage of bit line 16 is kept higher than that of the conventional device, by bit line voltage-load transistor 19, a satisfactorily high cell current can be assured. Since the bit line voltage is kept high, the p-n junction capacitance of the diffusion layer associated with read bit line 16 can be reduced. In addition, the voltage read out from memory cell transistor 11R onto bit line 16 is directly applied to a sense amplifier (not shown) without a bit line clamp circuit (64 in FIG. 1). Therefore, read access can be achieved at a higher speed than in the conventional EPROM using a clamp circuit.

In the above EPROM, (i) the channel concentration of write transistor 11W may be higher than that of read transistor 11R; (ii) the channel length of transistor 11W may be shorter than that of transistor 11R; (iii) the channel acceleration voltage of transistor 11W may be higher than that of transistor 11R; or (iv) the depth of the drain diffusion layer of transistor 11W may be less than that of transistor 11R. With one or more of these features, the hot electron injection rate in transistor 11R can be made lower than that in transistor 11W.

Practical examples of items (i) to (iv) are given below, with reference to a 256K EPROM having an NMOS structure:

(i) The average channel concentration of transistor 11R is set to be $4 \times 10^{16}$ cm$^{-3}$ at a dose of $2.3 \times 10^{12}$ cm$^{-2}$. In this case, the average channel concentration of transistor 11W is 10 times or more of that of transistor 11R.

(ii) In an IC pattern shown in FIG. 5, channel length Lr of transistor 11R is set to be 2.0 μm, and channel length Lw of transistor 11W is set to be 1.8 μm (Lr>Lw).

(iii) The channel acceleration voltage applied to transistor 11W is set to be 130 keV, and the channel acceleration voltage applied to transistor 11R is set to be a few fractions (e.g., $\frac{1}{2} \sim \frac{1}{3}$) of the voltage applied to transistor 11W.

Figure 6:
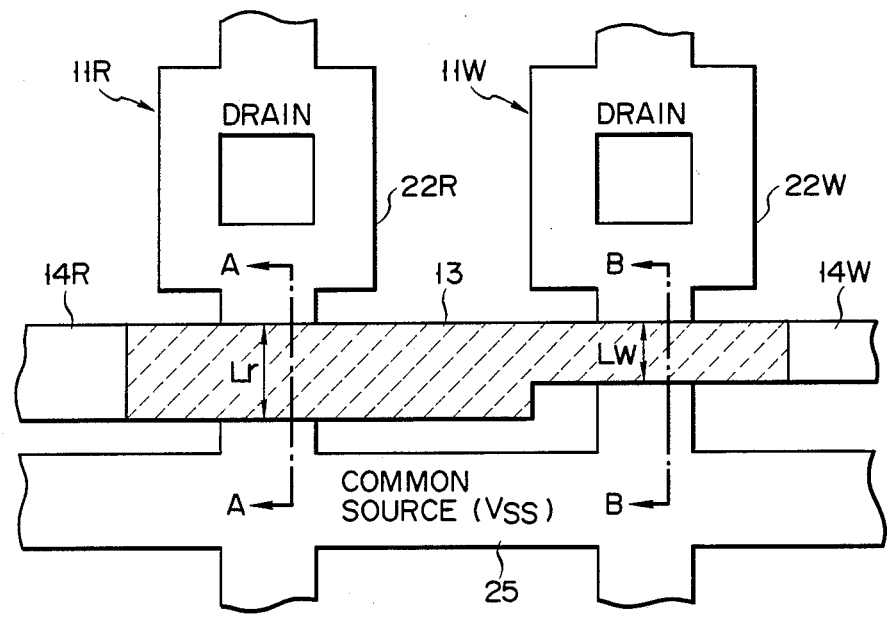
Figure 6A:
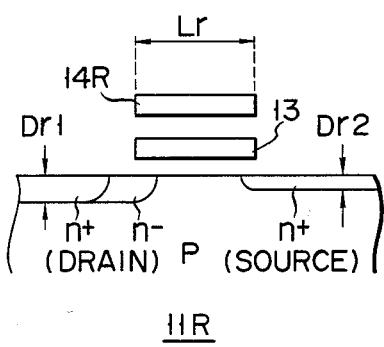
Figure 6B:
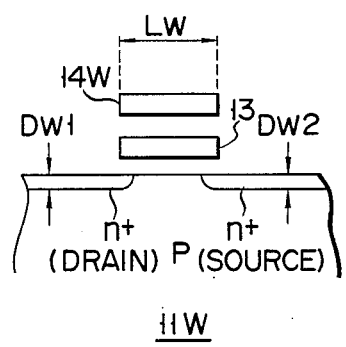

(iv) In an IC structure shown in FIGS. 6A and 6B, drain diffusion depth Dw1 of transistor 11W is set to be 0.2 μm, and its impurity concentration is set to be $1 \times 10^{20}$ cm$^{-3}$. Drain diffusion depth Dr1 of transistor 11R is set to be 0.4 μm, and the impurity concentration of the LDD structure (n−) is set to be $5 \times 10^{17}$ cm$^{-3}$ (Dw1<Dr1).

Items (ii) and (iv) may be combined as shown in FIGS. 6, 6A, and 6B. In this case, source diffusion depths Dr2 and Dw2 of transistors 11R and 11W and their impurity concentrations can be the same as those of the drain of transistor 11W, that is, 0.2 μm and $1 \times 10^{20}$ cm$^{-3}$, respectively.

FIG. 7 shows part of an EPROM arranged by applying the embodiment of FIG. 2. A pair of circuits (each is shown in FIG. 2) are used. Complementary write data signals Din and $\overline{Din}$ are respectively applied to write bit lines 20 and $\overline{20}$. Complementary read data signals, appearing on read bit lines Dout and $\overline{Dout}$, are commonly applied to sense amplifier 41 of a differential input type. The same reference numerals as in FIG. 2 denote the same parts in FIG. 7, and thus a detailed description thereof will be omitted.

A 4-transistor cell structure, as is shown in FIG. 7, is known in 1985 ISSCC TECHNICAL DIGEST, P. 162, S. PATLAK ET. AL., in which two read transistors and two write transistors are used, and their drains are separated from each other. In this known structure, however, the electrical characteristics of the read transistor are the same as those of the write transistor.

In contrast, according to the embodiment of FIG. 7, the electrical characteristics of the read transistor are different from those of the write transistor, so as to cause a difference in their respective hot electron injection rate. Bit line voltage-load transistors 19 are connected to read bit lines 16 and $\overline{16}$, respectively. Read data signals Dout and $\overline{Dout}$ on high-voltage bit lines 16 and $\overline{16}$ are differentially amplified by sense amplifier 41, thereby enabling read access at higher speed.

In the EPROM (FIG. 7) using four transistors, a technique for initiating memory cell selection upon detection of address transition, which is used in a static RAM, can be employed to achieve memory access at still higher speed. The above technique is described in the following reference:

IEEE JOURNAL OF SOLID-STATE CIRCUITS, Vol. SC-16, No. 5, October 1981, PP. 435–443, "A Fault-Tolerant 30 ns/375 mW 16K × 1 NMOS Static RAM"

The content of this reference is incorporated in the present application.

In the nonvolatile semiconductor memory device according to the present invention, as described above, the drains of the read transistor (11R) and the write transistor (11W) are separated from each other, and these transistors share a common floating gate and have different hot electron injection rates. The voltage of the read bit line (16) is higher than that of the conventional bit line and thus high-speed write/read access can be performed.

The following references are incorporated in the present application, in order to support the disclosed contents thereof:

ISSCC/85, P. 162, A 25 ns 16K CMOS PROM using a 4-Transistor Cell, Saroj Pathak et. al., 1985, February and IEEE J. Solid-State Circuits, Vol. SC-20, P. 964, A 6K CMOS PROM Using a Four-Transistor Cell and Differential Design Techniques, 1985, October.

What is claimed is:

1. A nonvolatile semiconductor memory device comprising
    memory cells, each including a read transistor and a write transistor which share a common floating gate and which have two separated drains, said read transistor being connected to a read bit line and said write transistor being connected to a write it line; and
    voltage-biasing means connected to said read bit line for biasing the voltage of said read bit line;
    wherein the hot electron injection rate in said read transistor is lower than that in said write transistor, and the impurity concentration of a drain diffusion layer of said read transistor is lower than that of said write transistor.

2. A nonvolatile semiconductor memory device comprising
    memory cells, each including a read transistor and a write transistor which share a common floating gate and which have two separated drains, said read transistor being connected to a read bit line and said write transistor being connected to a write bit line; and
    voltage-biasing means connected to said read bit line for biasing the voltage of said read bit line;
    wherein the hot electron injection rate in said read transistor is lower than that in said write transistor, and the channel impurity concentration of said write transistor is higher than that of said read transistor.

3. The device according to claim 2, wherein the channel length of said write transistor is shorter than that of said read transistor.

4. The device according to claim 2, wherein the channel acceleration voltage of said write transistor is higher than that of said read transistor.

5. The device according to claim 2, wherein a depth of a drain diffusion layer of said write transistor is less than that of said read transistor.

6. The device according to claim 3, wherein a depth of a drain diffusion layer of said write transistor is less than that of said read transistor.

7. The device according to claim 1, wherein a channel impurity concentration of said write transistor is higher than that of said read transistor.

8. The device according to claim 1, wherein a channel length of said write transistor is shorter than that of said read transitor.

9. The device according to claim 1, wherein a channel acceleration voltage of said write transistor is higher than that of said read transistor.

10. The device according to claim 1, wherein a depth of a drain diffusion layer of said write transistor is less than that of said read transistor.

11. The device according to claim 8, wherein a depth of a drain diffusion layer of said write transistor is less than that of said read transistor.

12. A 4-transistor cell type nonvolatile semiconductor memory device comprising
    memory cells, each including a first pair of transistors consisting of a first read transistor and a first write transistor which share a first floating gate and which have two separated drains, said first read transistor being connected to a first read bit line and said first write transistor being connected to a first write bit line, and a second pair of transistors consisting of a second read transistor and a second write transistor which share a second floating gate and which have two separated drains, said second read transistor being connected to a second read bit line and said second write transistor being connected to a second write bit line;
    a first voltage-biasing circuit connected to said first read bit line to bias the voltage of said first read bit line; and
    a second voltage-biasing circuit connected to said second read bit line to bias the voltage of said second read bit line;
    wherein the hot electron injection rate in said first read transistor is lower than that in said first write transistor, the hot electron injection rate in said second read transistor is lower than that in said second write transistor, and the impurity concentration of the drain diffusion layer of each of said first and second read transistors is lower than that of each of said first and second write transistors.

13. A 4-transistor cell type nonvolatile semiconductor memory device comprising
    memory cells, each including a first pair of transistors consisting of a a first read transistor and a first write transistor which share a first floating gate and which have two separated drains, said first read transistor being connected to a first read bit line and said first write transistor being connected to a first write bit line, and a second pair of transistors consisting of a second read transistor and a second write transistor which share a second floating gate and which have two separated drains, said second read transistor being connected to a second read bit line and said second write transistor being connected to a second write bit line;
    a first voltage-biasing circuit connected to said first read bit line to bias the voltage of said first read bit line; and
    a second voltage-biasing circuit connected to said second read bit line to bias the voltage of said second read bit line;
    wherein the hot electron injection rate in said first read transistor is lower than that in said first write transistor, the hot electron injection rate in said second read transistor is lower than that in said second write transistor, and the channel impurity concentration of each of said first and second write transistors is higher than that of each of said first and second read transistors.

14. The device according to claim 12 or 13, wherein a channel length of each of said first and second wrtte transistors is shorter than that of each of said first and second read transistors.

15. The device according to claim 12 or 13, wherein a channel acceleration voltage of each of said first and second write transistors is higher than that of each of said first and second read transistors.

16. The device according to claim 12 or 13, wherein a depth of a drain diffusion layer of each of said first and second write transistors is less than that of each of said first and second read transistors.

17. The device according to claim 14, wherein a depth of a drain diffusion layer of each of said first and second write transistors is less than that of each of said first and second read transistors.

* * * * *